United States Patent
Kim et al.

(10) Patent No.: US 8,822,998 B2
(45) Date of Patent: Sep. 2, 2014

(54) ORGANIC LIGHT EMITTING DISPLAY DEVICE

(75) Inventors: Seong-Min Kim, Yongin (KR); Jun-Ho Choi, Yongin (KR); Jin-Koo Chung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 698 days.

(21) Appl. No.: 13/064,141

(22) Filed: Mar. 8, 2011

(65) Prior Publication Data

US 2011/0220908 A1    Sep. 15, 2011

(30) Foreign Application Priority Data

Mar. 10, 2010 (KR) .................. 10-2010-0021420

(51) Int. Cl.
  *H01L 29/04*    (2006.01)
  *H01L 29/10*    (2006.01)
  *H01L 31/00*    (2006.01)

(52) U.S. Cl.
  USPC .. 257/59; 257/72; 257/E27.06; 257/E27.061; 257/E27.111; 257/E27.112; 257/E33.062; 257/E33.064; 438/28; 438/30; 438/34; 438/69; 438/142; 438/149; 438/190; 438/197; 438/286; 438/301; 313/504; 313/506; 313/498; 313/512; 349/56; 349/58; 349/69; 349/153; 349/155; 445/24; 445/25; 345/36; 345/44; 345/55; 345/76; 345/87

(58) Field of Classification Search
  CPC ............ H01L 27/3262; H01L 27/3248; H01L 27/3251
  USPC ......... 257/59, 72, E27.06, E27.061, E27.111, 257/E21.112, E27.113, E27.114, E33.062, 257/E33.063, E33.064, E33.065; 438/28–30, 34, 69, 286, 190, 142, 149, 438/151, 197, 301; 313/498–512; 445/24, 445/25; 349/56, 58, 69, 153, 155, 156; 345/36, 44–46, 55, 76, 87, 92
  See application file for complete search history.

(56) References Cited

U.S. PATENT DOCUMENTS

| | | | |
|---|---|---|---|
| 6,784,009 | B2 | 8/2004 | Lim et al. |
| 2006/0097263 | A1 | 5/2006 | Lee et al. |
| 2010/0044692 | A1* | 2/2010 | Kim et al. ................ 257/40 |

FOREIGN PATENT DOCUMENTS

| | | |
|---|---|---|
| JP | 2002-196705 A | 7/2002 |
| KR | 10 2004-0076939 A | 9/2004 |
| KR | 10 2006-0044066 A | 5/2006 |
| KR | 10 2007-0065681 A | 6/2007 |
| KR | 10 2007-0089545 A | 8/2007 |
| KR | 10 2008-0104452 A | 12/2008 |
| KR | 10 2009-0084202 A | 8/2009 |

* cited by examiner

*Primary Examiner* — Meiya Li
(74) *Attorney, Agent, or Firm* — Lee & Morse, P.C.

(57) ABSTRACT

An organic light emitting display device includes a substrate, a plurality of sub-pixels on the substrate, each sub-pixel including a first region configured to emit light and a second region configured to transmit external light, a plurality of thin film transistors disposed in the first region of the each sub-pixel, a plurality of first electrodes disposed in the first region of each sub-pixel and electrically connected to the thin film transistors, a first insulating layer on at least a portion of the first region of each sub-pixel to cover a portion of the first electrode, an organic emission layer on the first electrode, a second insulating layer on at least a portion of the second region of each sub-pixel, the second insulating layer including a plurality of openings therein, and a second electrode covering the organic emission layer, the first insulating layer, and the second insulating layer.

19 Claims, 2 Drawing Sheets

ORGANIC LIGHT EMITTING DISPLAY DEVICE

BACKGROUND

1. Field

Example embodiments relate to an organic light emitting display device, and more particularly, to a transparent organic light emitting display device.

2. Description of the Related Art

As organic light emitting display devices have superior characteristics, e.g., a wide viewing angle, high contrast ratio, short response time, and low power consumption, they are widely used in personal portable devices, e.g., MP3 players, mobile phones, television sets, etc. For example, organic light emitting display devices may include transparent organic light emitting display devices, e.g., devices constructed using transparent thin film transistors and transparent organic light emitting devices.

In a conventional transparent organic light emitting display device, a cathode may be formed of a semi-transparent reflective type thin film. However, a cathode of a semi-transparent reflective type thin film may not be adequate for manufacturing large panels.

SUMMARY

Embodiments are therefore directed to a transparent organic light emitting display device, which substantially overcomes one or more of the problems due to the limitations and disadvantages of the related art.

It is therefore a feature of an embodiment to provide a transparent organic light emitting display device capable of being applied to large display panels.

It is therefore another feature of an embodiment to provide a transparent organic light emitting display device having high transmittance with respect to external light.

At least one of the above and other features and advantages may be realized by providing an organic light emitting display device, including a substrate, a plurality of sub-pixels on the substrate, each sub-pixel including a first region configured to emit light and a second region configured to transmit external light, a plurality of thin film transistors disposed in the first region of the each sub-pixel, a plurality of first electrodes disposed in the first region of each sub-pixel and electrically connected to the thin film transistors, a first insulating layer on at least a portion of the first region of each sub-pixel to cover a portion of the first electrode, an organic emission layer on the first electrode, a second insulating layer on at least a portion of the second region of each sub-pixel, the second insulating layer including a plurality of openings therein, and a second electrode covering the organic emission layer, the first insulating layer, and the second insulating layer.

The second insulating layer may include a first surface facing the substrate, a second surface opposite the first surface, and a lateral surface defining the openings, the openings extending from the second surface toward the first surface. The first insulating layer may be only in the first region of each sub-pixel, and the second insulating layer is only in the second region of each sub-pixel. The second electrode may cover the second surface of the second insulating layer and a portion of the lateral surface of the second insulating layer.

The second insulating layer may include discrete segments spaced apart from each other along a horizontal direction, the openings being positioned between the segments. The second electrode may include a plurality of discrete segment on respective segments of the second insulating layer.

The second electrode may include a plurality of discrete segments spaced apart from each other in the second region of each sub-pixel. A distance between the first and second surfaces of the second insulating layer may be greater than a thickness of the first insulating layer. The organic light emitting display device may further include a sealing structure, the sealing structure being in contact with the second insulating layer via the second electrode and not in contact with the first insulating layer.

The second electrode may be formed of a light-reflection material. The first electrode may be formed of a light-transmission material.

The second regions of at least two adjacent sub-pixels may be connected to each other.

A region of the opening opened by the second side may be wider than a region of the opening opened by the first side.

The first insulating layer and the second insulating layer may be formed of an identical material.

The first region of the each sub-pixel may include an emission region and a circuit region, the thin film transistors may be disposed in the circuit region, and the first electrode may be disposed in the emission region.

The emission region and the circuit region of the each sub-pixel may be adjacent to each other.

The organic light emitting display device may further include a passivation layer covering the thin film transistors, the first electrodes may be formed on the passivation layer, and the first side may contact the passivation layer. The openings may expose the passivation layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
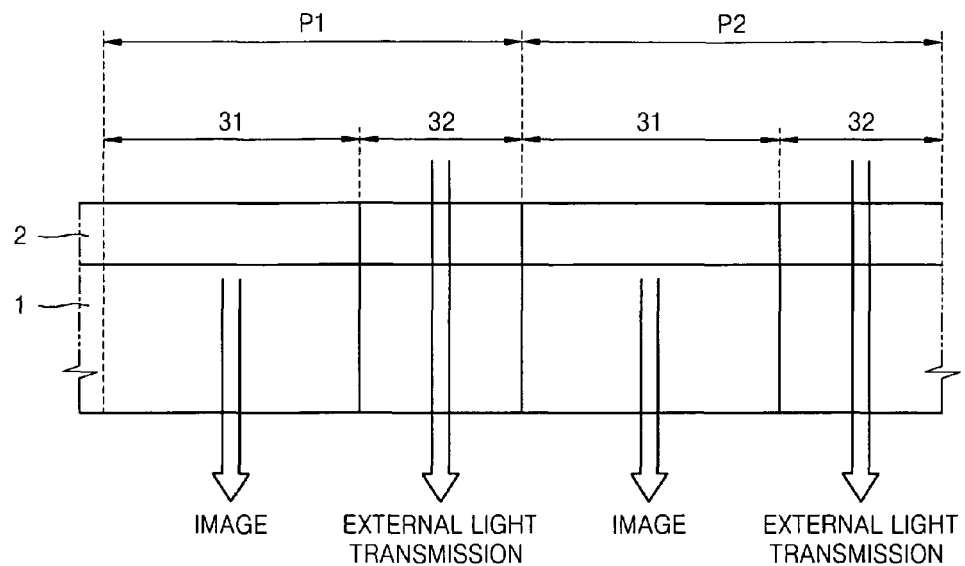
FIG. 1 illustrates a schematic cross-sectional view of an organic light emitting display device according to an embodiment.

Korean Patent Application No. 10-2010-0021420, filed on Mar. 10, 2010, in the Korean Intellectual Property Office, and entitled: "Organic Light Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Example embodiments will now be described more fully with reference to FIG. 1. FIG. 1 illustrates a schematic cross-sectional view of an organic light emitting display device according to an embodiment.

Referring to FIG. 1, an organic light emitting display device according to embodiments may include a substrate 1 and a display unit 2 on the substrate 1. In the organic light emitting display device, external light may be input via the display unit 2 and the substrate 1.

As will be described later, the display unit 2 may transmit external light. Referring to FIG. 1, the display unit 2 allows a user positioned below the substrate 1 to observe an image formed on an external surface of the display unit 2, i.e., a surface of the display unit 2 facing away from the substrate 1.

FIG. 1 illustrates two adjacent sub-pixels, i.e., a first sub-pixel P1 and a second sub-pixel P2, of the organic light emitting display device according to the present embodiment. Each of the first and second sub-pixels P1 and P2 may include a first region 31 and a second region 32.

An image may be displayed on the display unit 2 in the first region 31, while external light may pass through the display unit 2 in the second region 32. In other words, since each of the first and second sub-pixels P1 and P2 includes the first region 31, i.e., where images are displayed, and the second region 32, i.e., which transmits external light, a user may see an external image through the second region 32 when the user does not want to see the image displayed through the first region 31. That is, a user may see both the image on the display unit 2 via the first region 31, and an external image, e.g., a view positioned beyond the external surface of the display unit 2, via the second region 32. Thus, the second region 32 may not include devices, e.g., a thin film transistor, a capacitor, and an organic light emitting device. Accordingly, external light transmittance may be maximized and distortion of a transmitted image due to interference of the devices, e.g., a thin film transistor, a capacitor, and an organic light emitting device, may be prevented or substantially minimized.

Figure 2:
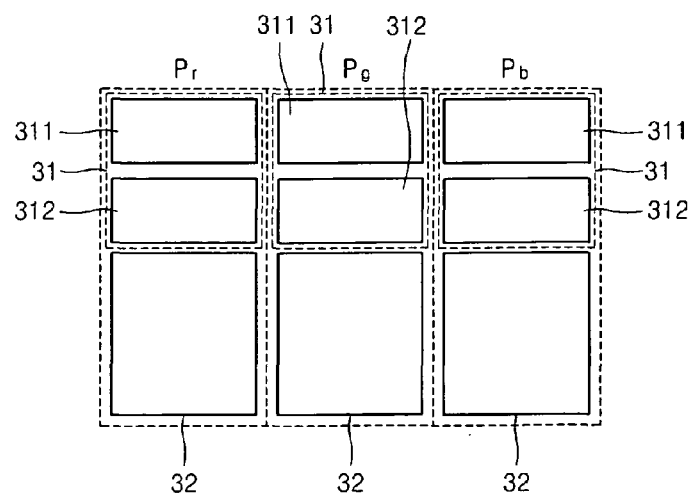
FIG. 2 illustrates a schematic plan view of an organic light emitting display device according to an embodiment.

FIG. 2 illustrates a schematic plan view of a red sub-pixel Pr, a green sub-pixel Pg, and a blue sub-pixel Pb that are adjacent to one another in an organic light emitting display device according to embodiments. Referring to FIG. 2, each of the red, green, and blue sub-pixels Pr, Pg, and Pb may include a circuit region 311 and an emission region 312 in the first region 31. The circuit region 311 and the emission region 312 may be adjacent to each other, and the second region 32 that transmits external light may be adjacent to the first region 31.

As illustrated in FIG. 2, independent second regions 32 may be included in the red, green, and blue sub-pixels Pr, Pg, and Pb, respectively. That is, each second region 32 may be separated, e.g., completely separated, from a second region 32 of an adjacent sub-pixel, e.g., a second region 32 of a red sub-pixel Pr may be separated from a second region 32 of the green sub-pixel Pg.

Figure 3:
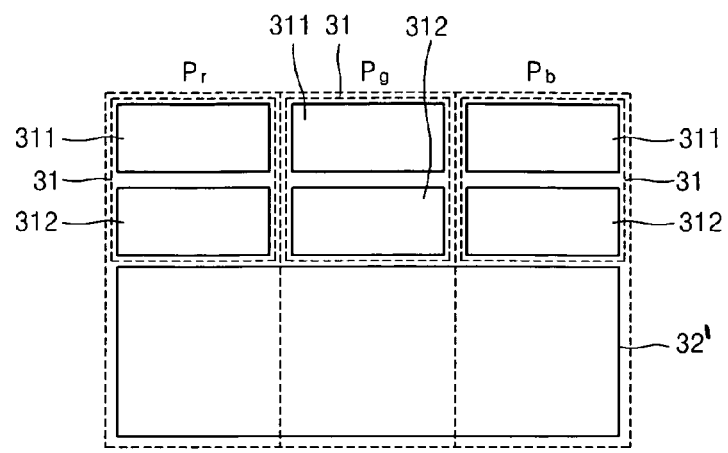
FIG. 3 illustrates a schematic plan view of an organic light emitting display device according to another embodiment.

Alternatively, as illustrated in FIG. 3, a plurality of second regions may be connected to one another across the red, green, and blue sub-pixels Pr, Pg, and Pb. For example, second regions of the red, green, and blue sub-pixels Pr, Pg, and Pb may be combined into a single second region 32', so one pixel having the red, green, and blue sub-pixels Pr, Pg, and Pb may have a single second region 32' across the red, green, and blue sub-pixels Pr, Pg, and Pb. In the embodiment of FIG. 3, an area of the second region 32' through which external light passes is increased, and thus transmittance of the entire display unit 2 may be increased. It is noted, however, that although the second regions of the red, green, and blue sub-pixels Pr, Pg, and Pb are integrally connected to one another in FIG. 3, example embodiments are not limited thereto, e.g., second regions of only two adjacent sub-pixels from among the red, green, and blue sub-pixels Pr, Pg, and Pb may be connected to each other.

Figure 4:
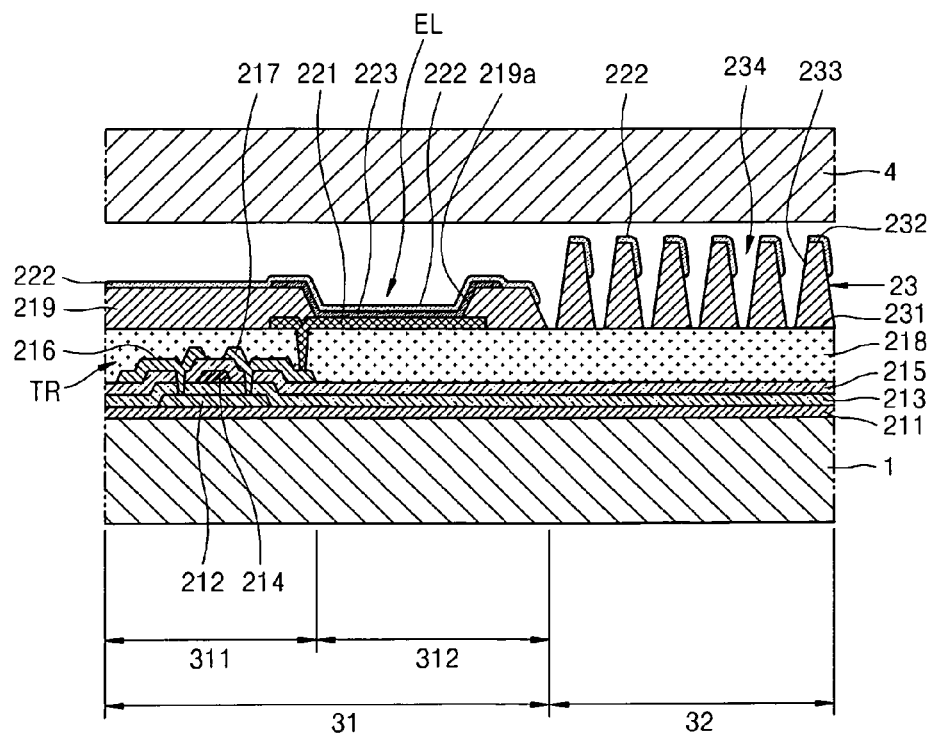
FIG. 4 illustrates a detailed cross-sectional view of a sub-pixel of an organic light emitting display device according to an embodiment.

FIG. 4 illustrates a cross-sectional view of the red, green, or blue sub-pixel Pr, Pg, or Pb illustrated in FIGS. 2 and 3.

As illustrated in FIG. 4, a thin film transistor TR may be arranged in the circuit region 311 of the sub-pixel. However, a pixel circuit including the thin film transistor TR may also be included in the circuit region 311. Alternatively, the circuit region 311 may further include a plurality of thin film transistors TR and a storage capacitor. In this case, wires, e.g., scan lines, data lines, and Vdd lines, connected to the thin film transistors TR and the storage capacitor may be further included in the circuit region 311.

An organic light emitting diode EL may be disposed in the emission region 312 of the sub-pixel. The organic light emitting diode EL is electrically connected to the thin film transistor TR of the circuit region 311.

A buffer layer 211 may be formed on the substrate 1, and a pixel circuit including the thin film transistor TR may be formed on the buffer layer 211. The buffer layer 211 may prevent impurity elements from penetrating into the substrate 1 and may planarize a surface of the substrate 1. The buffer layer 211 may be formed of any of various materials that can perform the functions described above. For example, the buffer layer 211 may be formed of an inorganic material, e.g., silicon oxide, silicon nitride, silicon oxynitride, aluminum oxide, aluminum nitride, titanium oxide, or titanium nitride, an organic material, e.g., polyimide, polyester, or acryl, or stacks of organic and inorganic materials. The buffer layer 211 is not an essential element and may not be formed at all.

Next, a semiconductor active layer 212 may be formed on the buffer layer 211. The semiconductor active layer 212 may be formed of polycrystalline silicon, but is not limited thereto and may be formed of a semiconductor oxide. For example, the semiconductor active layer 212 may be a G-I-Z-O layer, i.e., a $(In_2O_3)b(Ga_2O_3)c(ZnO)$ layer (where a, b, and c are natural numbers that respectively satisfy a≥0, b≥0, and c≥0). When the semiconductor active layer 212 is formed of a semiconductor oxide, light transmittance in the circuit region 311 of the first region 31 may be increased. Thus, external light transmittance of the entire display unit 2 may be increased.

A gate insulating layer 213 may be formed on the buffer layer 211 so as to cover the semiconductor active layer 212, and a gate electrode 214 may be formed on the gate insulating layer 213. An interlayer insulating layer 215 may be formed on the gate insulating layer 213 so as to cover the gate electrode 214. A source electrode 216 and a drain electrode 217 may be formed on the interlayer insulating layer 215 so as to contact the semiconductor active layer 212 via contact holes. It is noted that the structure of the thin film transistor TR is not limited to the above-described structure, and the thin film transistor TR may have various other structures.

A passivation layer 218 may be formed to cover the thin film transistor TR. The passivation layer 218 may be a single-layered or multi-layered insulating layer, an upper surface of which is planarized. The passivation layer 218 may be formed of an inorganic material and/or an organic material.

As illustrated in FIG. 4, a first electrode 221 of the organic light emitting diode EL electrically connected to the thin film transistor TR may be formed on the passivation layer 218. The first electrode 221 may have an island shape corresponding to each sub-pixel.

A first insulating layer 219 may be formed of an organic and/or inorganic insulating material on the passivation layer 218 to cover at least a portion of the first electrode 221. The first insulating layer 219 may have a first opening 219a that exposes, e.g., only, a central portion of the first electrode 221. For example, the first insulating layer 219 may cover only a portion of the first region 31, e.g., the first insulating layer 219 does not necessarily cover the entire first region 31, so an edge of the first electrode 221 may be covered. The first insulating layer 219 may not be formed in the second region 32.

An organic emission layer 223 and a second electrode 222 may be sequentially stacked on a portion of the first electrode 221 that is exposed through the first opening 219a. The second electrode 222 covers the organic emission layer 223, the first insulating layer 219, and a portion of a second insulating layer 23, which will be described later. The second electrodes 222 corresponding to all of the sub-pixels may be electrically connected to one another.

The organic emission layer 223 may be a low molecular weight organic layer or a polymer organic layer. When the organic emission layer 223 is a low molecular weight organic layer, the organic emission layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various materials, e.g., copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic layer may be formed by vacuum deposition. Herein, the HIL, the HTL, the ETL, and the EIL are common layers and may be commonly applied to red, green, and blue pixels.

The first electrode 221 may function as an anode, and the second electrode 222 may function as a cathode. Alternatively, the first electrode 221 may function as a cathode, and the second electrode 222 may function as an anode.

According to an embodiment, the first electrode 221 may be a transparent electrode, and the second electrode 222 may be a reflection electrode. The first electrode 221 may include a high work function material, e.g., ITO, IZO, ZnO, $In_2O_3$, or the like. The second electrode 222 may be formed of a metal having a low work function, e.g., Ag, Mg, Al, Pt, Pd, Au, Ni, Nd, Ir, Cr, Li, or Ca. Accordingly, the organic light emitting diode EL is a bottom emission type in which light is emitted toward the substrate 1. In this case, the second electrode 222 may also be formed to have sufficient thickness to prevent a voltage drop in the entire display unit 2. Thus, the second electrode 222 may be suitable to be applied to large displays.

Example embodiments are not limited thereto, and the second electrode 222 may also be a transparent type electrode. In this case, the second electrode 222 may be formed of a thin metal film, and thus, a voltage drop may occur. Thus, a special bus line may be installed to contact the second electrode 222.

The passivation layer 218, the gate insulating layer 213, the interlayer insulating layer 215, and the first insulating layer 219 may be transparent insulating layers. Herein, the substrate 1 may have a transmittance greater or equal to a total transmittance of the transparent insulating layers, i.e., a transmittance greater or equal to a total transmittance of the passivation layer 218, the gate insulating layer 213, the interlayer insulating layer 215, and the first insulating layer 219.

A sealing substrate 4 may be installed over the second electrode 222. The sealing substrate 4 is located outside the display unit 2 and bonded with the substrate 1 by a sealant (not shown) so as to protect the second electrode 222 from external air. A filler (not shown) may be filled between the sealing substrate 4 and the second electrode 222, and a moisture absorbent may also be interposed therebetween. A sealing structure for the display unit 2 is not limited to the use of the sealing substrate 4, e.g., a film-shaped sealing structure may be used.

As illustrated in FIG. 4, the second insulating layer 23 may be installed, e.g., only, in the second region 32 of the sub-pixel. The second insulating layer 23 may be on, e.g., directly on, the passivation layer 218, e.g., adjacent to the first insulating layer 219.

The second insulating layer 23 may include a plurality of openings therein, e.g., a plurality of discrete segments spaced apart from each other via the openings. In particular, the second insulating layer 23 may have a first surface 231 facing the substrate 1 and contacting the passivation layer 218, e.g., positioned directly on the passivation layer 218, and a second surface 232 facing away from the substrate 1, i.e., opposite the first surface 231. The second insulating layer 23 may further include a lateral surface 233 that defines a plurality of second openings 234 extending from the second surface 232 toward the first surface 231. That is, a plurality of lateral surfaces 233 may be spaced apart from each other and extend between the first and second surfaces 231 and 232 to define the plurality of second openings 234 spaced apart from each other along a horizontal direction, e.g., each opening 234 may be between two adjacent segments of the second insulating layer 23.

Each of the second openings 234 may be formed to have a hole shape. Thus, the second openings 234 may be a plurality of holes formed from the second surface 232 toward the first surface 231 or may be strips connected to one another across adjacent sub-pixels. The second openings 234 may be formed to expose portions of the passivation layer 218 that are covered by the second insulating layer 23. For example, the second insulating layer 23 may include a plurality of trapezoid-shaped segments, so the plurality of openings 234 may have inverted-trapezoidal cross-sections.

The second electrode 222 may be formed on the second surface 232 of the second insulating layer 23 in the second region 32 of the sub-pixel. For example, the second electrode 222 may include a plurality of discrete segments on respective segments of the second insulating layer 23 in the second region 32 of the sub-pixel.

The second electrode 222 is a common electrode for providing a constant voltage to the entire display unit 2, so a metal material may be deposited on the entire display unit 2, i.e., both the first and second regions 31 and 32. Since the second electrode 222 is formed even in the second region 32 where external light is to be transmitted, the discrete segments of the second electrode 222 on respective segments of the second insulating layer 23 may prevent or substantially minimize loss of external light transmittance through the second electrode 222 in the second region 32. Accordingly, a transparent display may be achieved.

It is very difficult to conventionally pattern the second electrode 222 to be formed only outside the second region 32. In particular, if only a region corresponding to the second region 32 is shielded during the deposition, it may be difficult to form a mask corresponding to the shielded region, and a photolithographic process, i.e., a wet process, required to remove the second electrode 222 from the second region 32 may badly affect the organic emission layer 223 below the second electrode 222. Therefore, according to example embodiments, the second insulating layer 23 having the second openings 234 may be formed, and thus, formation of the second electrode 222 in the second region 32 may be minimized. That is, since the second electrode 222 in the second region 32 includes a plurality of discrete segments spaced apart from each other, an overall portion of the second region 32 overlapped by the second electrode 222 may be substantially minimized.

In other words, when the second electrode 222 is commonly formed on the entire display unit 2 with the first insulating layer 219 formed in the first region 31 and the second insulating layer 23 having the second openings 234 formed in the second region 32, the second electrode 222 may be formed on the entire upper surface of the first insulating layer 219 in the first region 31 and formed only on portions of the second surface 232 and the lateral surface 233 of the second insulating layer 23. Accordingly, the second electrode 222 may be very sporadically formed in the second region 32. Thus, obstruction of external light through the second region 32 may be prevented as much as possible, while still having the second electrode 222 formed in the second region 32, and the external light transmittance in the second region 32 may be increased.

The second insulating layer 23 may be formed of a material used to form the first insulating layer 219. The second insulating layer 23 may be formed simultaneously with the first insulating layer 219 in the same process. To this end, while the first insulating layer 219 is being patterned using a halftone mask as a mask for patterning the first insulating layer 219, the second insulating layer 23 may be patterned simultaneously to form the lateral surfaces 233.

When such a halftone mask is used, the second insulating layer 23 may be formed to be thicker than the first insulating layer 219 along a vertical direction, i.e., a direction substantially perpendicular to the horizontal direction. In other words, a distance between the first and second surfaces 231 and 232 of the second insulating layer 23 may be greater than the thickness of the first insulating layer 219. Accordingly, the second insulating layer 23 may serve as a spacer preventing the organic light emitting device EL from being damaged due to depression of the sealing substrate 4 by a user pushing the top of the sealing substrate 4.

The second openings 234 may be designed so that an open region defined by the second surfaces 232 may be wider than an open region defined by the first surfaces 231. In other words, a width of each opening 234 may decrease along the horizontal direction, as a distance from the passivation layer 218 decreases. Accordingly, as illustrated in FIG. 4, the lateral surfaces 233 of each of the second openings 234 may have an inverted triangle shape, so that the second electrode 222 may not be formed in a deep portion of the second opening 234, i.e., the second electrode 222 may be formed only on the second surfaces 232 and upper portions of the lateral surfaces 233 of the second insulating layer 23. It is noted that the shape of the lateral surfaces 233 is not limited to the inverted triangle shape illustrated in FIG. 4, and the shape of the lateral surfaces 233 may vary according to an etching ratio or the like of an etchant for forming the second openings 234. In order to further prevent the second electrode 222 from being formed in the deep portion of the second opening 234, a deposition speed, a deposition duration, and a deposition angle may be appropriately controlled when the second electrode 222 is formed.

According to example embodiments, a second electrode may be formed on the second insulating layer 23 with the second openings 234 in the second region 32 where external light is transmitted, so that a decrease in light transmittance in the second region 32 may be prevented as much as possible. Thus, transmittance with respect to external light may be increased according to a simple method, and a user may easily observe external images. In contrast, when a continuous second electrode in the second region is formed of a metal having a low resistance and a high electrical conductivity, the metal may be thinned to increase light transmittance. However, the thinned metal may cause an increased resistance due to the decreased thickness, and such a second electrode may not be suitable for large panels.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display device, comprising:
   a substrate;
   a plurality of sub-pixels on the substrate, each sub-pixel including a first region configured to emit light and a second region configured to transmit external light;
   a plurality of thin film transistors disposed in the first region of the each sub-pixel;
   a plurality of first electrodes disposed in the first region of each sub-pixel, each of the plurality of first electrodes being electrically connected to one of the plurality of thin film transistors;
   a first insulating layer on at least a portion of the first region of each sub-pixel to cover a portion of each of the plurality of first electrodes;
   an organic emission layer on the first electrode;
   a second insulating layer on at least a portion of the second region of each sub-pixel, the second insulating layer including a plurality of openings therein; and
   a second electrode covering the organic emission layer, the first insulating layer, and the second insulating layer,
   wherein the second electrode includes a plurality of discrete segments spaced apart from each other in the second region of each of the plurality of sub-pixels.

2. The organic light emitting display device as claimed in claim 1, wherein the second insulating layer includes a first surface facing the substrate, a second surface opposite the first surface, and a lateral surface defining the openings, the openings extending from the second surface toward the first surface.

3. The organic light emitting display device as claimed in claim 2, wherein the first insulating layer is only in the first region of each sub-pixel, and the second insulating layer is only in the second region of each sub-pixel.

4. The organic light emitting display device as claimed in claim 2, wherein the second electrode covers the second surface of the second insulating layer and a portion of the lateral surface of the second insulating layer.

5. The organic light emitting display device as claimed in claim 1, wherein the second insulating layer includes discrete segments spaced apart from each other along a horizontal direction, the openings being positioned between the segments.

6. The organic light emitting display device as claimed in claim 1, wherein the second electrode includes a plurality of discrete segments on respective segments of the second insulating layer.

7. The organic light emitting display device as claimed in claim 1, wherein a thickness of the second insulating layer is greater than a thickness of the first insulating layer.

8. The organic light emitting display device as claimed in claim 1, wherein the second electrode includes a light-reflection material.

9. The organic light emitting display device as claimed in claim 1, wherein each of the plurality of first electrodes includes a light-transmission material.

10. The organic light emitting display device as claimed in claim 1, wherein the second regions of at least two adjacent sub-pixels of the plurality of sub-pixels are connected to each other.

11. The organic light emitting display device as claimed in claim 1, wherein a width of each opening in the second insulating layer decreases, as a distance from the substrate decreases.

12. The organic light emitting display device as claimed in claim 1, wherein the first insulating layer and the second insulating layer include an identical material.

13. The organic light emitting display device as claimed in claim 1, wherein the first region of each of the plurality of subpixels includes an emission region and a circuit region, each of the plurality of thin film transistors being disposed in the circuit region of each of the plurality of sub-pixels, and each of the plurality of first electrodes being disposed in the emission region of each of the plurality of sub-pixels.

14. The organic light emitting display device as claimed in claim 13, wherein the emission region and the circuit region of the each sub-pixel are adjacent to each other.

15. The organic light emitting display device as claimed in claim 1, further comprising a passivation layer covering the thin film transistors, the first electrodes and the second insulating layer being on the passivation layer.

16. The organic light emitting display device as claimed in claim 1, wherein the second insulating layer contacts the passivation layer, and the openings in the second insulating layer expose the passivation layer.

17. The organic light emitting display device as claimed in claim 1, further comprising a sealing structure, wherein the sealing structure is not in direct contact with the first insulating layer.

18. An organic light emitting display device, comprising:
a substrate;
a plurality of sub-pixels on the substrate, each sub-pixel including a first region configured to emit light and a second region configured to transmit external light;
a plurality of thin film transistors disposed in the first region of the each sub-pixel;
a plurality of first electrodes disposed in the first region of each sub-pixel, each of the plurality of first electrodes being electrically connected to one of the plurality of thin film transistors;
a first insulating layer on at least a portion of the first region of each sub-pixel to cover a portion of each of the plurality of first electrodes;
an organic emission layer on the first electrode;
a second insulating layer on at least a portion of the second region of each sub-pixel, the second insulating layer including a plurality of openings therein; and
a second electrode covering the organic emission layer, the first insulating layer, and the second insulating layer,
wherein the second electrode includes a plurality of discrete segments on respective segments of the second insulating layer.

19. An organic light emitting display device, comprising:
a substrate;
a plurality of sub-pixels on the substrate, each sub-pixel including a first region configured to emit light and a second region configured to transmit external light;
a plurality of thin film transistors disposed in the first region of the each sub-pixel;
a plurality of first electrodes disposed in the first region of each sub-pixel, each of the plurality of first electrodes being electrically connected to one of the plurality of thin film transistors;
a first insulating layer on at least a portion of the first region of each sub-pixel to cover a portion of each of the plurality of first electrodes;
an organic emission layer on the first electrode;
a second insulating layer on at least a portion of the second region of each sub-pixel, the second insulating layer including a plurality of openings therein; and
a second electrode covering the organic emission layer, the first insulating layer, and the second insulating layer,
wherein the second insulating layer contacts a passivation layer, and the openings in the second insulating layer expose the passivation layer.

* * * * *